(12) United States Patent
Liu

(10) Patent No.: US 9,632,383 B2
(45) Date of Patent: Apr. 25, 2017

(54) FRINGE FIELD SWITCHING (FFS) TYPE TFT-LCD STRUCTURE AND MANUFACTURING METHOD

(71) Applicant: Shenzhen China Star Optoelectronics Technology Co., Ltd., Shenzhen, Guangdong (CN)

(72) Inventor: Yang Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 80 days.

(21) Appl. No.: 14/759,255

(22) PCT Filed: Mar. 19, 2015

(86) PCT No.: PCT/CN2015/073861
§ 371 (c)(1),
(2) Date: Jul. 6, 2015

(87) PCT Pub. No.: WO2016/138670
PCT Pub. Date: Sep. 9, 2016

(65) Prior Publication Data
US 2016/0377895 A1    Dec. 29, 2016

(30) Foreign Application Priority Data
Mar. 2, 2015 (CN) .......................... 2015 1 0092277

(51) Int. Cl.
*H01L 21/336* (2006.01)
*H01L 27/12* (2006.01)
*H01L 29/786* (2006.01)
*G02F 1/1368* (2006.01)
(Continued)

(52) U.S. Cl.
CPC ........ *G02F 1/1368* (2013.01); *G02F 1/13439* (2013.01); *G02F 1/134363* (2013.01); *H01L 27/1225* (2013.01); *H01L 27/1288* (2013.01); *G02F 2001/134372* (2013.01); *G02F 2001/136231* (2013.01); *G02F 2201/123* (2013.01); *G02F 2202/10* (2013.01); *H01L 29/7869* (2013.01)

(58) Field of Classification Search
CPC ............... H01L 27/1288; H01L 27/124; H01L 27/1259; H01L 27/1214; H01L 21/336; G02F 1/134363; G02F 2001/134372; G02F 2001/13629
USPC ...................... 438/34; 257/E21.409; 349/141
See application file for complete search history.

(56) References Cited

U.S. PATENT DOCUMENTS

2006/0146256 A1\* 7/2006 Ahn .................. G02F 1/134309
349/141
2013/0161604 A1\* 6/2013 Huang .................. H01L 27/124
257/43

\* cited by examiner

*Primary Examiner* — Thomas L Dickey
*Assistant Examiner* — Changhyun Yi
(74) *Attorney, Agent, or Firm* — Andrew C. Cheng

(57) ABSTRACT

In a method for manufacturing a fringe field switching (FFS) display type thin-film transistor array substrate: a common electrode, a gate electrode and a first pixel electrode are formed on a substrate by a first mask process; an active layer and a second pixel electrode are formed by a second mask process; a gate insulator is disposed between the active layer, the second pixel electrode and the common electrode, the gate electrode, the first pixel electrode; and a drain electrode and a source electrode are formed by a third mask process. Moreover, an FFS display type thin film transistor array substrate fabricated by the above method also is provided.

18 Claims, 4 Drawing Sheets

(51) Int. Cl.
*G02F 1/1343* (2006.01)
*G02F 1/1362* (2006.01)

FRINGE FIELD SWITCHING (FFS) TYPE TFT-LCD STRUCTURE AND MANUFACTURING METHOD

TECHNICAL FIELD

The present invention relates to field of liquid crystal display, and particularly to a new structure and fabrication method of thin film transistor array for FFS display type.

DESCRIPTION OF RELATED ART

Thin film transistor liquid crystal display (TFT-LCD), is a plane ultrathin display device. According to the electric field direction of driving liquid crystal, TFT-LCD can be divided into vertical electric field type and horizontal electric field type. In the vertical electric field type TFT-LCD, a pixel electrode is required to form on an array substrate, and a common electrode is formed on a color film substrate. In the horizontal electric field type TFT-LCD, a pixel electrode and a common electrode are required to form on an array substrate simultaneously. Therefore, to fabricate the horizontal electric field type TFT-LCD array substrate, an extra patterning process of fabricating the common electrode is required. The vertical electric field type TFT-LCD includes a twisted nematic (TN) type TFT-LCD. The horizontal electric field type TFT-LCD includes a fringe field switching (FFS) type TFT-LCD, an in-plane switching (IPS) type TFT-LCD. The Horizontal electric field type TFT-LCD, especially the TFT-LCD for FFS display type has advantages of wide viewing angle, high aperture ratio and so on, and it has been widely used in liquid display field.

Recently, the fabrication of TFT-LCD array for FFS display type is formed by multiple patterning processes. Each patterning process includes mask, exposure, developing, etching and peeling technology etc. Wherein the etching technology includes dry etching and wet etching. And a degree of complexity of manufacturing a TFT-LCD array substrate can be measured by a number of patterning processes. Reducing the number of patterning process means reduction in production cost. The existing technology of six patterning processes of the TFT-LCD array substrate for FFS display type, includes common electrode patterning, gate line and gate electrode patterning, active layer patterning, source/drain electrode patterning, via patterning, and pixel electrode patterning.

SUMMARY

In view of the above shortcomings of prior art, the present invention firstly provides a method for fabricating a thin film transistor array substrate for FFS display type, which can reduce the number of mask processes, and reduce difficulty of the fabrication process of thin film transistor array substrate for FFS display type.

In an exemplary embodiment, a method for fabricating an FFS display type thin-film transistor array substrate, includes: forming a common electrode, a gate electrode and a first pixel electrode on the substrate by a first mask process; forming an active layer and a second pixel electrode by a second mask process; wherein a gate insulator is disposed between the active layer, the second pixel electrode and the common electrode, the gate electrode, the first pixel electrode; and forming a drain electrode and a source electrode by a third mask process.

In an exemplary embodiment, the method includes steps of: step 1: providing a substrate, a first transparent conductive film and a first metal film sequentially formed on the substrate; step 2: forming the common electrode, the gate electrode and the first pixel electrode with predetermined patterns by the first mask process, wherein the first pixel electrode is formed from the first transparent conductive film and exposed, the common electrode and the gate electrode are respectively formed from the first transparent conductive film and the first metal film, the common electrode and the first pixel electrode are electrically connected; step 3: forming the gate insulator, a semiconductor film and the second transparent conductive film sequentially on the substrate with above structure; step 4: forming the active layer and the second pixel electrode with predetermined patterns correspondingly on the gate insulator by the second mask process; wherein the active layer is formed from the semiconductor film and located above the gate electrode, the second transparent conductive film is persisted on the active layer corresponded to the drain electrode and source electrode; the second pixel electrode is a slit electrode and formed from the semiconductor film and the second transparent conductive film; step 5: forming a second metal film on the substrate with above structure; and step 6: forming the drain electrode and the source electrode with predetermined patterns on the active layer by the third mask process, so as to form a thin film transistor; wherein the drain electrode and the source electrode are formed from the second metal film, the drain electrode is electrically connected to the second pixel electrode.

In an exemplary embodiment, in the first mask process, the first transparent conductive film and the first metal film are exposed, developed and etched by gray tone mask technology, semi gray scale mask technology or single slit mask technology, so as to form the common electrode, the gate electrode and the first pixel electrode that have the predetermined patterns and are separated with each other.

In an exemplary embodiment, in the second mask process, the semiconductor film and the second transparent conductive film are exposed, developed and etched by gray tone mask technology, semi gray scale mask technology or single slit mask technology, so as to form the active layer and the second pixel electrode that have the predetermined patterns and are separated with each other.

In an exemplary embodiment, material of the first transparent conductive film and the second transparent conductive film is ITO, IZO, AZO or some other transparent conductive oxide material.

In an exemplary embodiment, material of the active layer is $SnO_2$, $In_2O_3$ or ZnO based oxide semiconductor material.

In an exemplary embodiment, material of the first metal film and the second metal film is Al, Mo, Cu, Ag or some other conductive metal.

In an exemplary embodiment, a shape of the first pixel electrode is rectangular, pectinate or fish-bone shape, the shape of the second pixel electrode is pectinate or fish-bone shape.

In an exemplary embodiment, after the step 6, an insulating passivation layer is further formed on the substrate with above structure.

In an exemplary embodiment, the material of the insulating passivation layer is $SiN_x$ or $SiO_x$.

In an exemplary embodiment, the first metal film, the second metal film, the first transparent conductive film, the second transparent conductive film and the semiconductor film are prepared by a sputtering process respectively; the gate insulator and the insulating passivation layer are formed by a chemical vapor deposition process respectively.

An thin film transistor array substrate for FFS display type, includes a substrate, a common electrode, a gate electrode, a first pixel electrode, a gate insulator, an active layer, a second pixel electrode, a source electrode and a drain electrode. The common electrode, the gate electrode and the first pixel electrode are disposed on the substrate, the common electrode and the first pixel electrode being electrically connected. The gate insulator is coated on the common electrode, the gate electrode and the first pixel electrode. The active layer and the second pixel electrode are disposed on the gate insulator, the active layer arranged above the gate electrode correspondingly, the second pixel electrode arranged above the first pixel electrode correspondingly. The source electrode and the drain electrode are disposed on the active layer, the drain electrode electrically connected to the second pixel electrode, transparent conductive films located between the drain electrode and the active layer, and between the source electrode and the active layer respectively. Wherein the common electrode, the gate electrode and the first pixel electrode are in the same layer, and formed by a first mask fabrication process; the active layer and the second pixel electrode are in the same layer, and formed by a second mask process; the drain electrode and the source electrode are in the same layer, and formed by a third mask process.

In an exemplary embodiment, material of the first pixel electrode and the second pixel electrode includes ITO, IZO, AZO or some other transparent conductive oxide material.

In an exemplary embodiment, material of the active layer is $SnO_2$, $In_2O_3$ or ZnO based oxide semiconductor material.

In an exemplary embodiment, material of the gate electrode, source electrode and drain electrode includes Al, Mo, Cu, Ag or some other conductive metal.

In an exemplary embodiment, a shape of the first pixel electrode is rectangular, pectinate or fish-bone shape, a shape of the second pixel electrode is pectinate or fish-bone shape.

In an exemplary embodiment, an insulating passivation layer is formed on the substrate.

In an exemplary embodiment, material of the insulating passivation layer is $SiN_x$ or $SiO_x$.

Compared with the existing technology, the method provided in the present invention, only three mask processes are used to form the FFS display type thin film transistor array substrate, and it can reduce the difficulty of the process, improve the production efficiency, and reduce production cost.

BRIEF DESCRIPTION OF THE DRAWINGS

As mentioned, the purpose of the invention is to reduce the number of mask process in the preparation process of an FFS display type thin film transistor array substrate, so as to reduce the difficulty of technology, improve the production efficiency and lower production cost. The method of the present invention includes: firstly, forming a common electrode, a gate and a first pixel electrode on a substrate by a first mask process; then forming an active layer and a second pixel electrode by a second mask process; wherein a gate insulator is located between the active layer, the second pixel electrode and the common electrode, the gate electrode, the first pixel electrode; finally forming a drain electrode and a source electrode by a third mask process. There are three mask processes in all to fabricate the FFS display type thin film transistor array substrate.

The present invention will now be described more specifically with reference to the following embodiments. It is to be noted that the following descriptions of embodiments are presented herein for purpose of illustration and description only. It is not intended to be exhaustive or to be limited to the precise form disclosed.

Referring to FIG. 1 and FIG. 2a-FIG. 2h, a method for fabricating an FFS display type thin-film transistor array substrate according to an exemplary embodiment of the present invention includes the following steps.

Figure 1:
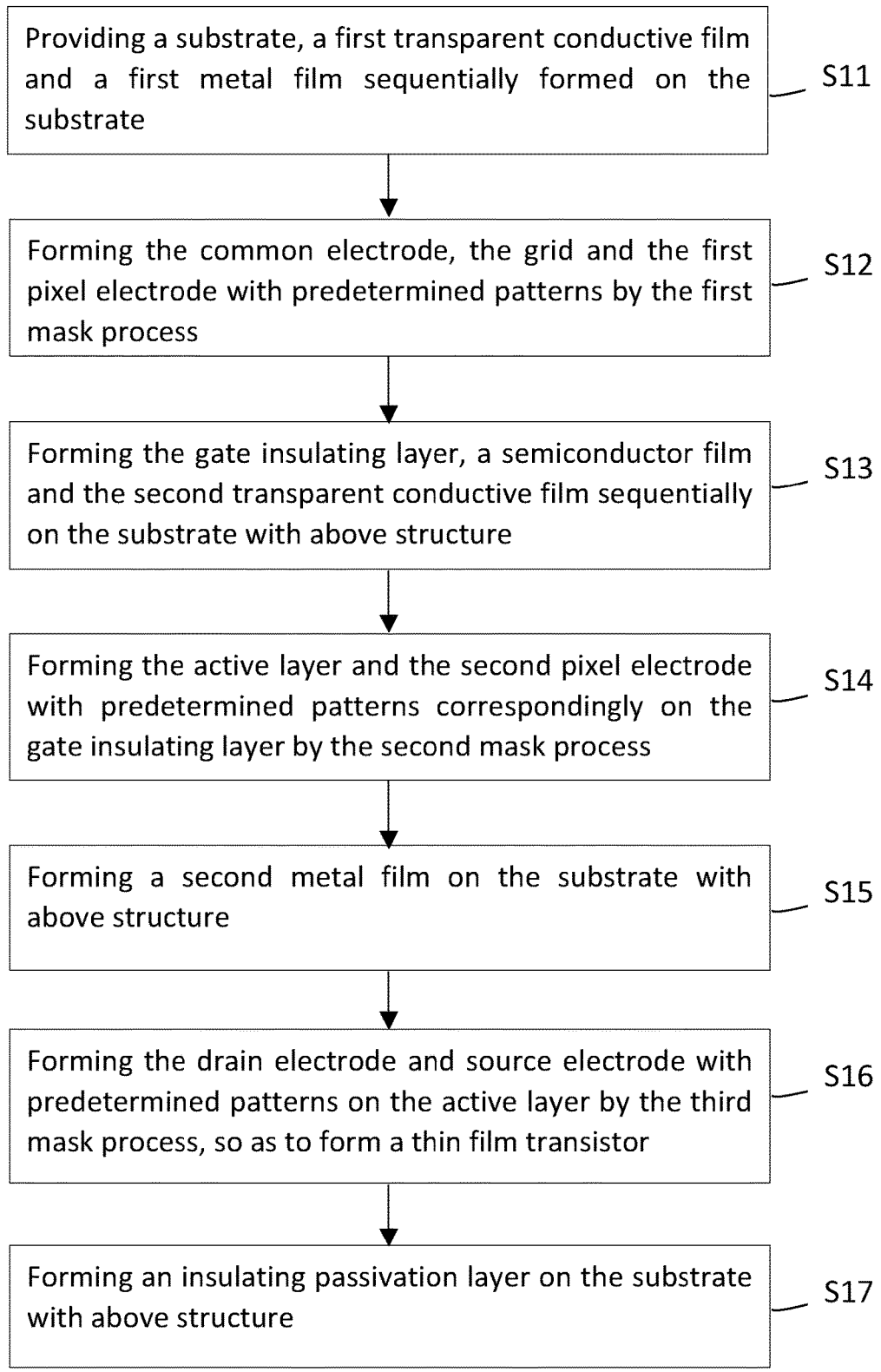
FIG. 1 is a schematic flow chart of a fabricating method according to an exemplary embodiment of the present invention.
Figure 2A:
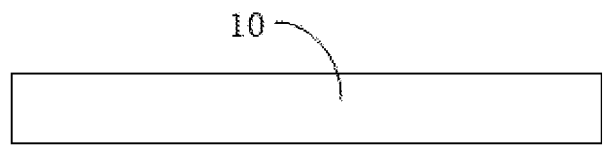
FIG. 2a-FIG. 2h show different products formed in corresponding steps of the fabricating method according to an exemplary embodiment of the present invention.
Figure 2B:
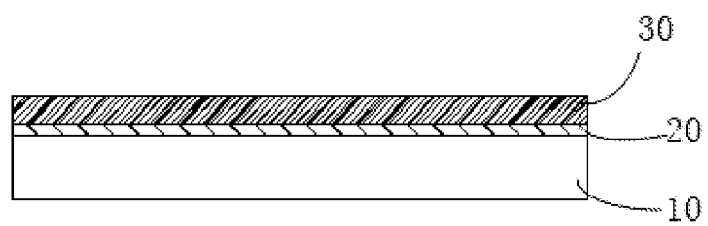

S11, firstly, a substrate 10 is provided. A first transparent conductive film 20 and a first metal film 30 are sequentially formed on the substrate on the substrate 10 (as shown in FIG. 2a and FIG. 2b). The substrate 10 can be made of transparent material. For example, the substrate 10 is a glass substrate, a quartz substrate or other suitable material substrate. Material of the first transparent conductive film 20 can be ITO, IZO or AZO. Material of the first metal layer 30 can be Al, Mo, Cu or Ag. Specifically, the first transparent conductive layer 20 and the first metal layer 30 are respectively formed by sputtering processes.

Figure 2C:
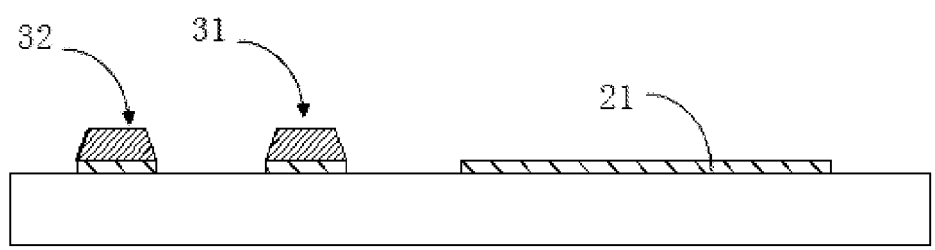

S12, a common electrode 32, a gate electrode 31 and a first pixel electrode 21 are formed with a predetermined pattern by a first mask process (as shown in FIG. 2c). The first pixel electrode 21 is formed from the first transparent conductive film 20 and exposed. The common electrode 32 and the gate electrode 31 are respectively formed from the first transparent conductive film 20 and the first metal film 30. The common electrode 32 and the first pixel electrode 21 are electrically connected. Specifically, a shape of the first pixel electrode 21 can be rectangular, pectinate or fish-bone shape. As shown in FIG. 2c, the shape of the first pixel electrode 21 is rectangular.

More specifically, in the first mask process, the first transparent conductive film 20 and the first metal film 30 are exposed, developed and etched by gray tone mask technology or semi gray scale mask technology or single slit mask technology, so as to form the common electrode 32, the gate electrode 31 and the first pixel electrode 21 that have the predetermined patterns and are separated with each other. The first mask process can be performed as follows: coating a layer of photosensitive material that is a photoresist layer on the first metal layer 30, and then making the light irradiate on the photoresist layer after the light passes through a gray-scale mask, a semi gray scale mask or a single slit mask, so as to make the photoresist layer exposed. The gray scale mask, the semi gray scale mask or the single slit mask has the predetermined pattern thereon, therefore a part of the light can pass through the gray scale mask, the semi gray scale mask or the single slit mask and irradiate the photoresist layer to make the photoresist layer exposed selectively. At the same time the pattern on the gray scale mask, the semi gray scale mask or the single slit mask can be copied completely to the photoresist layer. Then, a part of the photoresist is removed by a suitable developer, such that the required pattern can be obtained on the photoresist layer. Then, a part of the first metal layer 30 and a part of the first transparent conductive film layer 20 are removed by an etching process. The etching process can be a wet etching process and/or a dry etching process. Finally, the rest of the patterned photoresist layer is removed, and then the common electrode 32, the gate electrode 31 and the first pixel electrode 21 with the predetermined pattern are formed.

Figure 2D:
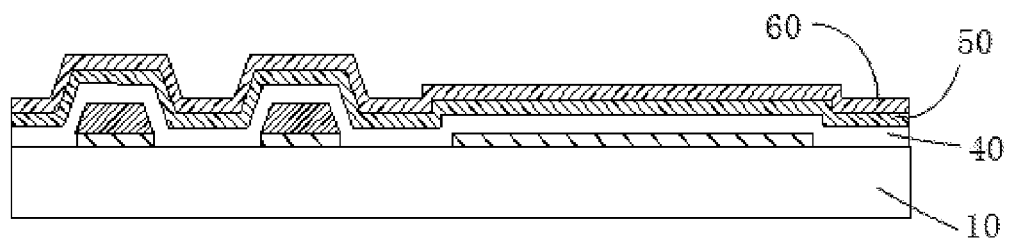

S13, a gate insulator 40, a semiconductor film 50 and a second transparent conductive film 60 are sequentially formed on the substrate 10 with the above structure (as shown in FIG. 2d). Material of the gate insulator 40 can be $SiN_x$ or $SiO_x$, and the gate insulator 40 can be formed mainly by chemical vapor deposition (CVD). Material of the semiconductor layer 50 can be transparent oxide, such as ZnO, $SnO_2$ or $In_2O_3$ based transparent oxide material, and the semiconductor layer 50 can be formed by sputtering. Material of the second transparent conductive film 60 can be ITO, IZO or AZO, and the second transparent conductive film 60 can be formed by sputtering.

Figure 2E:
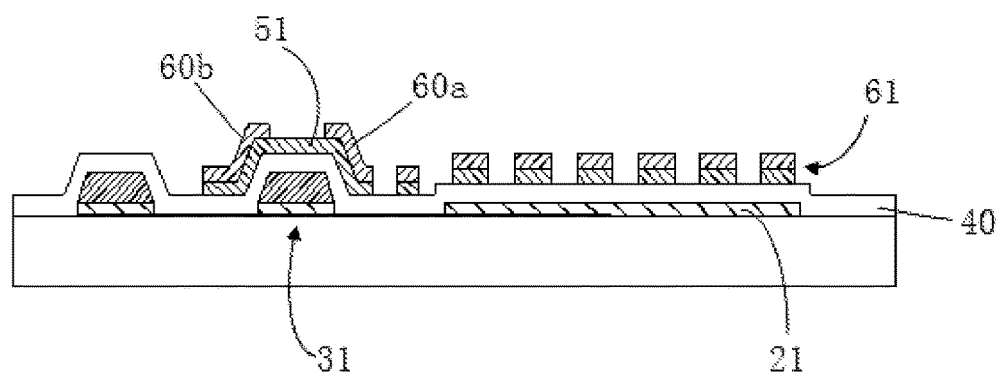

S14, an active layer 51 and a second pixel electrode 61 with predetermined patterns are formed correspondingly on the gate insulator 40 by the second mask process (as shown in FIG. 2e). The active layer 51 is formed from the semiconductor film 50 and located above the gate electrode 31, and the second transparent conductive film (60a, 60b) is persisted on the active layer 51 corresponded to the drain electrode and source electrode. The second pixel electrode 61 is a slit electrode and formed from the semiconductor film 50 and the second transparent conductive film 60. The second pixel electrode 61 located above the first pixel electrode 21 correspondingly. Specifically, a shape of the second pixel electrode 61 can be comb or fish-bone shape. As shown in FIG. 2e, the shape of the second pixel electrode 61 is pectinate.

More specifically, in the second mask process, the semiconductor film 50 and the second transparent conductive film 60 are exposed, developed and etched by the gray tone mask technology, the semi gray scale mask technology or the single slit mask technology, so as to form the active layer 51 and the second pixel electrode 61 that have the predetermined patterns and are separated with each other. The second mask process can be similar to the above first mask process.

Figure 2F:
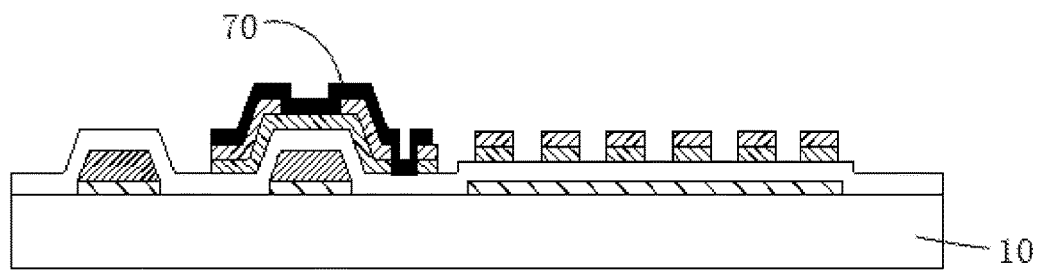

S15, a second metal film 70 is formed on the substrate with above structure 10 (as shown in FIG. 2f). Material of the second metal layer 70 can be Al, Mo, Cu or Ag, and the second metal layer 70 can be formed by sputtering.

Figure 2G:
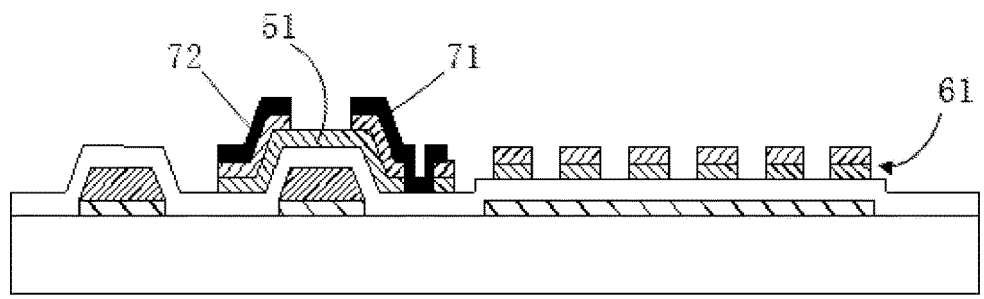

S16, a drain electrode 71 and a source electrode 72 with predetermined patterns are formed on the active layer 51 by the third mask process, so that the thin film transistor can be formed (as shown in FIG. 2g). The drain electrode 71 and the source electrode 72 are formed from the second metal film 70, and the drain electrode 71 is electrically connected to the second pixel electrode 61.

Figure 2H:
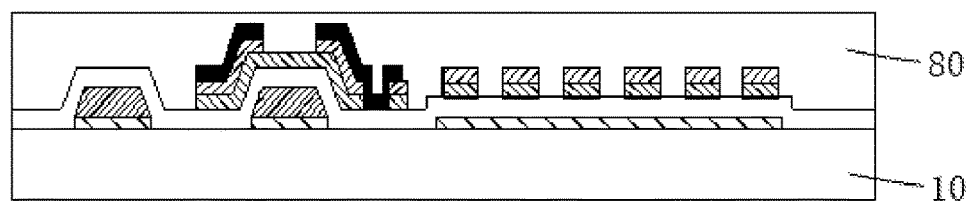

S17, an insulating passivation layer 80 is formed on the substrate 10 with above structure (as shown in FIG. 2h). Material of the insulating passivation layer 80 can be $SiN_x$ or $SiO_x$, and the insulating passivation layer 80 can be formed by CVD. The insulating passivation layer 80 can be mainly used to isolate the air.

Figure 3:
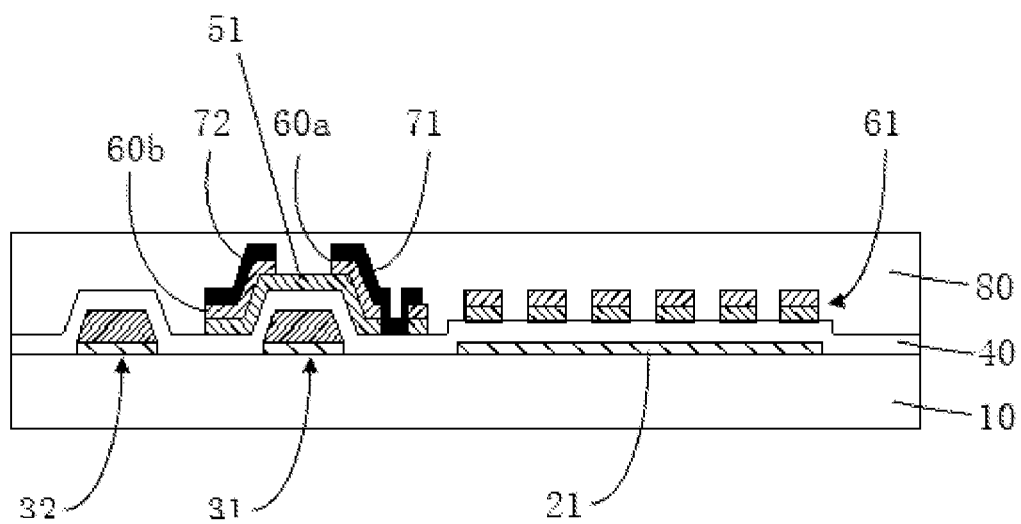
FIG. 3 is a schematic view of a thin film transistor array substrate for FFS display type according to an exemplary embodiment of the present invention.

As shown in FIG. 3, the FFS display type thin film transistor array substrate fabricated in accordance with the above method includes the substrate 10. The common electrode 32, the gate electrode 31 and the first pixel electrode 21 are disposed on the substrate and in the same layer. The common electrode 32 and the first pixel electrode 21 are electrically connected with each other. The gate insulator 40 is coated on the common electrode 32, the gate electrode 31 and the first pixel electrode 21. The active layer 51 and the second pixel 61 electrode are disposed on the gate insulator 40. The active layer 51 is arranged above the gate electrode 31 correspondingly. The second pixel electrode 61 is arranged above the first pixel electrode 21 correspondingly. The drain electrode 71 and the source electrode 72 are disposed on the active layer 51. The drain electrode 71 is electrically connected to the second pixel electrode 61. The transparent conductive film 60a is located between the drain electrode 71 and the active layer 51, and the transparent conductive film 60b is located between the source electrode 72 and the active layer 51. The insulating passivation layer 80 is further coated on the above structure.

In the fabricating method of the exemplary embodiments of the present invention, only three mask processes are used to form the FFS display type thin film transistor array substrate, and it can reduce the difficulty of the process, improve the production efficiency, and reduce production cost. In the FFS display type thin film transistor array substrate fabricated by the method, a layer of the transparent conductive film is added between the active layer and the source/drain electrode, so that the contact resistance of the source and drain regions can be reduced, and the on-state current and other performances of the thin film transistor can be improved.

It is indicated that, in this specification, the relational terminologies such as "first" and "second" only are intended to discriminate an entity or operation from another entity or operation, and not necessarily to require or imply these entities or operations having actual relationships or orders existed there between. Moreover, the terminology of "including", "containing" or variations thereof is meant to encompass non-exclusive inclusion, so that a process, method, article or apparatus including a series of items not only includes listed items but also includes other item(s) not being explicitly listed or inherent item(s) of the process, method, article or apparatus. In the absence of more restrictive conditions, the item limited by the phraseology "including one" does not exclude the existence of additional identical item(s) in the process, method, article or apparatus including the item.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a fringe field switching (FFS) display type thin-film transistor array substrate, comprising:
   forming a common electrode, a gate electrode and a first pixel electrode on a substrate by a first mask process;
   forming an active layer and a second pixel electrode by a second mask process; wherein a gate insulator is disposed between the active layer, the second pixel electrode and the common electrode, the gate electrode, the first pixel electrode; and
   forming a drain electrode and a source electrode by a third mask process.

2. The method for fabricating an FFS display type thin-film transistor array substrate according to claim 1, wherein the method comprises steps of:

step 1: providing the substrate, a first transparent conductive film and a first metal film sequentially formed on the substrate;

step 2: forming the common electrode, the gate electrode and the first pixel electrode with predetermined patterns by the first mask process, wherein the first pixel electrode is formed from the first transparent conductive film and exposed, the common electrode and the gate electrode are respectively formed from the first transparent conductive film and the first metal film, the common electrode and the first pixel electrode are electrically connected;

step 3: forming the gate insulator, a semiconductor film and a second transparent conductive film sequentially on the substrate with above structure formed in the step 1 and the step 2;

step 4: forming the active layer and the second pixel electrode with predetermined patterns correspondingly on the gate insulator by the second mask process; wherein the active layer is formed from the semiconductor film and located above the gate electrode, the second transparent conductive film is persisted on the active layer corresponded to the drain electrode and source electrode; the second pixel electrode is a slit electrode and formed from the semiconductor film and the second transparent conductive film;

step 5: forming a second metal film on the substrate with above structure formed in the step 1, the step 2, the step 3 and the step 4; and step 6: forming the drain electrode and the source electrode with predetermined patterns on the active layer by the third mask process, so as to form a thin film transistor; wherein the drain electrode and the source electrode are formed from the second metal film, the drain electrode is electrically connected to the second pixel electrode.

3. The method for fabricating an FFS display type thin-film transistor array substrate according to claim 2, wherein in the first mask process, the first transparent conductive film and the first metal film are exposed, developed and etched by gray tone mask technology, semi gray scale mask technology or single slit mask technology, so as to form the common electrode, the gate electrode and the first pixel electrode that have the predetermined patterns and are separated with each other.

4. The method for fabricating an FFS display type thin-film transistor array substrate according to claim 2, wherein in the second mask process, the semiconductor film and the second transparent conductive film are exposed, developed and etched by gray tone mask technology, semi gray scale mask technology or single slit mask technology, so as to form the active layer and the second pixel electrode that have the predetermined patterns and are separated with each other.

5. The method for fabricating an FFS display type thin-film transistor array substrate according to claim 2, wherein material of the first transparent conductive film and the second transparent conductive film is ITO, IZO or AZO.

6. The method for fabricating an FFS display type thin-film transistor array substrate according to claim 2, wherein material of the first metal film and the second metal film is Al, Mo, Cu or Ag.

7. The method for fabricating an FFS display type thin-film transistor array substrate according to claim 2, wherein material of active layer is $SnO_2$, $In_2O_3$ or ZnO based oxide semiconductor material.

8. The method for fabricating an FFS display type thin-film transistor array substrate according to claim 2, wherein a shape of the first pixel electrode is rectangular, pectinate or fish-bone shape, a shape of the second pixel electrode is pectinate or fish-bone shape.

9. The method for fabricating an FFS display type thin-film transistor array substrate according to claim 8, wherein the first metal film, the second metal film, the first transparent conductive film, the second transparent conductive film and the semiconductor film are prepared by a sputtering process respectively; the gate insulator and the insulating passivation layer are formed by a chemical vapor deposition process respectively.

10. The method for fabricating an FFS display type thin-film transistor array substrate according to claim 2, wherein after the steps 6, an insulating passivation layer is further formed on the substrate with above structure formed in the step 1, the step 2, the step 3, the step 4, the step 5 and the step 6.

11. The method for fabricating an FFS display type thin-film transistor array substrate according to claim 10, wherein material of the insulating passivation layer is $SiN_x$ or $SiO_x$.

12. A fringe field switching (FFS) display type thin film transistor array substrate, comprising:

a substrate;

a common electrode, a gate electrode and a first pixel electrode disposed on the substrate, the common electrode and the first pixel electrode being electrically connected;

a gate insulator coated on the common electrode, the gate electrode and the first pixel electrode;

an active layer and a second pixel electrode disposed on the gate insulator, the active layer arranged above the gate electrode correspondingly, the second pixel electrode arranged above the first pixel electrode correspondingly;

a source electrode and a drain electrode disposed on the active layer, the drain electrode electrically connected to the second pixel electrode, transparent conductive films located between the drain electrode and the active layer, and between the source electrode and the active layer respectively;

wherein the common electrode, the gate electrode and the first pixel electrode are coexisted in a first layer; the active layer and the second pixel electrode are coexisted in a second layer above the first layer; the drain electrode and the source electrode are coexisted in a third layer above the first layer and the second layer.

13. The FFS display type thin film transistor array substrate according to claim 12, wherein material of the first pixel electrode and the second pixel electrode comprises ITO, IZO or AZO.

14. The FFS display type thin-film transistor array substrate according to claim 12, wherein material of active layer is $SnO_2$, $In_2O_3$ or ZnO based oxide semiconductor material.

15. The FFS display type thin film transistor array substrate according to claim 12, wherein material of the gate electrode, source electrode and drain electrode comprises Al, Mo, Cu or Ag.

16. The FFS display type thin film transistor array substrate according to claim 12, wherein a shape of the first pixel electrode is rectangular, pectinate or fish-bone shape, a shape of the second pixel electrode is pectinate or fish-bone shape.

17. The FFS display type thin film transistor array substrate according to claim 12, wherein an insulating passivation layer is formed on the substrate.

18. The FFS display type thin film transistor array substrate according to claim 17, wherein material of the insulating passivation layer is $SiN_x$ or $SiO_x$.

* * * * *